(12) United States Patent
Bhattacharyya

(10) Patent No.: US 10,153,039 B1
(45) Date of Patent: Dec. 11, 2018

(54) MEMORY CELLS PROGRAMMED VIA MULTI-MECHANISM CHARGE TRANSPORTS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/641,597

(22) Filed: Jul. 5, 2017

(51) Int. Cl.
| | |
|---|---|
| *G11C 11/56* | (2006.01) |
| *H01L 29/51* | (2006.01) |
| *H01L 29/72* | (2006.01) |
| *H01L 29/792* | (2006.01) |
| *H01L 29/49* | (2006.01) |
| *G11C 16/10* | (2006.01) |
| *G11C 16/14* | (2006.01) |
| *G11C 16/04* | (2006.01) |

(52) U.S. Cl.
CPC ...... *G11C 11/5671* (2013.01); *G11C 16/0466* (2013.01); *G11C 16/10* (2013.01); *G11C 16/14* (2013.01); *H01L 29/4966* (2013.01); *H01L 29/513* (2013.01); *H01L 29/517* (2013.01); *H01L 29/518* (2013.01); *H01L 29/7923* (2013.01)

(58) Field of Classification Search
CPC ............ G11C 11/5671; G11C 16/0466; H01L 29/4966; H01L 29/513; H01L 29/517; H01L 29/518; H01L 29/7923
See application file for complete search history.

(56) References Cited

U.S. PATENT DOCUMENTS

| | | |
|---|---|---|
| 4,870,470 A | 9/1989 | Bass et al. |
| 6,743,681 B2 | 6/2004 | Bhattacharyya |
| 6,743,682 B2 | 6/2004 | Woerlee et al. |
| 6,888,200 B2 | 5/2005 | Bhattacharyya |
| 6,903,969 B2 | 6/2005 | Bhattacharyya |
| 6,917,078 B2 | 7/2005 | Bhattacharyya |
| 6,998,667 B2 | 2/2006 | Bhattacharyya |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Allison Bernstein
(74) *Attorney, Agent, or Firm* — Brooks, Cameron & Huebsch, PLLC

(57) ABSTRACT

The present disclosure includes memory cells programmed via multi-mechanism charge transports. An example apparatus includes a semiconductor material, a tunneling material formed on the semiconductor material, a charge trapping material formed on the tunneling material, a charge blocking material formed on the charge trapping material, and a metal gate formed on the charge blocking material. The charge trapping material comprises gallium nitride (GaN), and the memory cell is programmed to the target state via the multi-mechanism charge transport such that charges are simultaneously transported to the charge trapping material through a plurality of different channels.

9 Claims, 6 Drawing Sheets

(56) References Cited

U.S. PATENT DOCUMENTS

| | | | |
|---|---|---|---|
| 7,012,297 B2 | 3/2006 | Bhattacharyya | |
| 7,042,027 B2 | 5/2006 | Bhattacharyya | |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,755,136 B2 * | 7/2010 | Nishikawa | H01L 21/28273 257/321 |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,406 B2 * | 6/2011 | Yasuda | H01L 21/28282 257/324 |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 8,294,197 B2 * | 10/2012 | Wang | H01L 29/42328 257/314 |
| 8,816,422 B2 * | 8/2014 | Wang | G11C 11/5671 257/324 |
| 2007/0034922 A1 | 2/2007 | Bhattacharyya | |
| 2008/0303080 A1 | 12/2008 | Bhattacharyya | |
| 2010/0090265 A1 | 4/2010 | Bhattacharyya et al. | |

OTHER PUBLICATIONS

Bhattacharyya et al., "Properties and Applications of Silicon Oxynitride Films", from IBM Technical Report TR.19.0399, presented at the Electrochemical Society (ECS) 150th Meeting, Oct. 1976, Las Vegas, NV, 20 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 545-648.

Lue et al., "A Novel P-Channel NAND-type Flash Memory with 2 bit/cell Operation and High Programming Throughput (>20 Mb/sec)",

(56) References Cited

OTHER PUBLICATIONS

IEEE International Electron Devices Meeting (IEDM) 2005, Dec. 5-7, 2005, Washington, D.C., 4 pages.
Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.
Luo et al., "Design of High Performance PFETs with Strained Si Channel and Laser Anneal", IEEE International Electron Devices Meeting (IEDM) 2005, Dec. 5-7, 2005, Washington D.C., pp. 495-498.
Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.
Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.
Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.
Moon et al., "Multi-Functional Universal Device using a Band-Engineered Vertical Structure", IEEE International Electron Devices Meeting (IEDM) 2011, Dec. 5-7, 2011, Washington D.C., pp. 551-554.
Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.
Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.
Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.
Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.
Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.
Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.
Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.
Taguchi, "NOR Flash Memory Technology", presented at 2006 IEEE International Electron Devices Meeting (IEDM) Short Course on Memory Technologies for 45nm and Beyond, Dec. 2006, 27 pages.
Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.
Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.
Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.
Zhang et al., "Novel ZrO2/Si3N4 Dual Charge Storage Layer to Form Step-up Potential Wells for Highly Reliable Multi-level Cell Application", IEEE International Electron Devices Meeting (IEDM) 2007, Dec. 10-12, 2005, Washington D.C., pp. 83-86.
Likharev, "Riding the Crest of a New Wave in Memory", IEEE Circuits and Devices Magazine, vol. 16, Issue 4, Jul. 2000, pp. 16-21.
Ramaswamy et al., "Engineering a Planar NAND Cell Scalable to 20nm and Beyond", 2013 5th IEEE Memory Workshop, May 26-29, 2013, Monterey, CA, pp. 5-8.
Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.
Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

* cited by examiner

MEMORY CELLS PROGRAMMED VIA MULTI-MECHANISM CHARGE TRANSPORTS

TECHNICAL FIELD

The present disclosure relates generally to semiconductor devices and, more particularly, to memory cells programmed via multi-mechanism charge transports.

BACKGROUND

Memory devices are typically provided as internal, semiconductor, integrated circuits and/or external removable devices in computers or other electronic devices. There are many different types of memory including volatile and non-volatile memory. Volatile memory may require power to maintain its data and may include random-access memory (RAM), dynamic random access memory (DRAM), static random access memory (SRAM), and synchronous dynamic random access memory (SDRAM), among others. Non-volatile memory may provide persistent data by retaining stored data when not powered and may include NROM Flash memory, NAND Flash memory, NOR Flash memory, read only memory (ROM), and resistance variable memory such as phase change random access memory (PCRAM), resistive random access memory (RRAM), magnetic random access memory (MRAM), and programmable conductive memory, among others.

Memory devices may be utilized as volatile and non-volatile memory for a wide range of electronic applications in need of high memory densities, high reliability, and low power consumption. Non-volatile and/or volatile memory may be used in, for example, personal computers, portable memory sticks, solid state drives (SSDs), digital cameras, cellular telephones, portable music players such as MP3 players, and movie players, among other electronic devices.

Memory cells in an array architecture may be programmed to a target (e.g., desired) state. For instance, electric charge may be placed on or removed from the charge storage structure (e.g., floating gate) of a field effect transistor (FET) based memory cell to program the cell to a particular data state. The amount of stored charge on the charge storage structure of an FET-based memory cell may be indicated by a resulting threshold voltage (Vt) state of the cell.

For example, a single level memory cell (SLC) may be programmed to a targeted one of two different data states, which may be represented by the binary units 1 or 0. A binary data state represents 1 bit of data with $2^1$ (e.g., 2) data states. As an additional example, some memory cells may be programmed to a targeted one of more than two data states, such as, for instance, to a targeted four bits of data with $2^4$ (e.g., 16) data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs may provide higher density memories without increasing the number of memory cells since each cell may represent more than one digit (e.g., more than one bit), and therefore may provide high data storage capacity.

DETAILED DESCRIPTION

Figure 1:
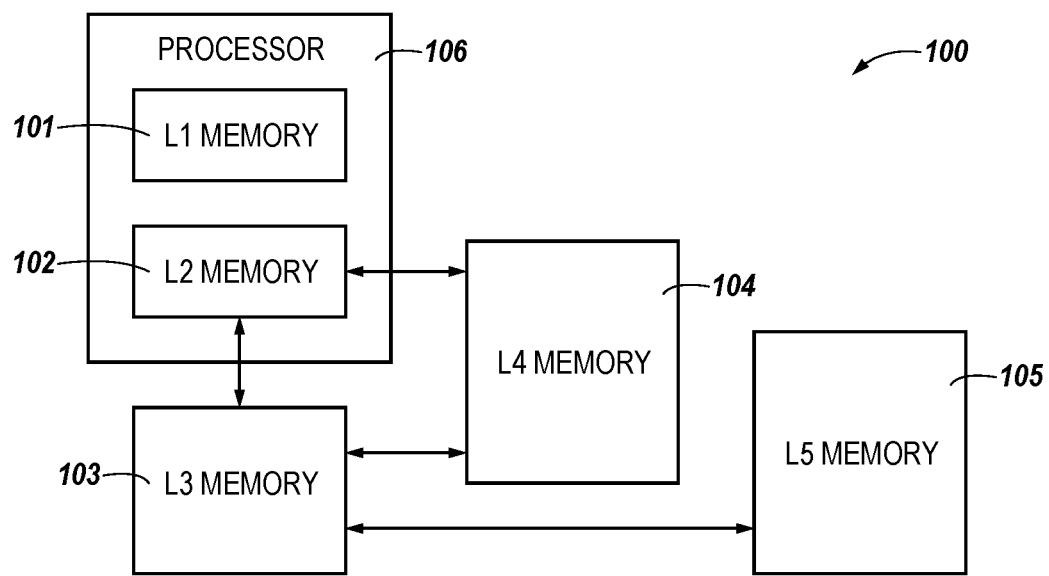
FIG. 1 is a block diagram of an apparatus in the form of a computing system in accordance with a number of embodiments of the present disclosure.

The present disclosure includes memory cells programmed via multi-mechanism charge transport. An example apparatus includes a semiconductor material, a tunneling material formed on the semiconductor material, a charge trapping material formed on the tunneling material, a charge blocking material formed on the charge trapping material, and a metal gate formed on the charge blocking material. The charge trapping material includes gallium nitride (GaN), and the memory cell may be programmed to the target state via the multi-mechanism charge transport such that charges are simultaneously transported to the charge trapping material through a plurality of different channels.

Memory cells described in the present disclosure may have a characteristic (e.g., programming operation characteristic) such as utilizing a plurality of different channels in being programmed to a target state. For example, the memory cells described in the present disclosure may be programmed to the target state by simultaneously transporting charges (e.g., electrons and/or holes) to, for example, the charge trapping material(s) through the plurality of different channels such as from the semiconductor material (e.g., via a direct tunneling and/or a Fowler-Nordheim (F-N) tunneling) and/or from the metal gate. Such programming mechanism may be referred to herein as the multi-mechanism charge transport.

The multi-mechanism charge transport described in with the present disclosure may provide benefits, such as fast and/or energy-efficient programming operations (e.g., write/erase operation, among others). As such, memory devices that utilize the memory cells being programmed via the multi-mechanism charge transport may have fast programming time, consume less power, and/or have a higher performance compared to those memory cells being programmed to a target state via a single channel.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" may include both singular and plural referents, unless the context clearly dictates otherwise. In addition, "a number of", "at least one", and "one or more", (e.g., a number of memory arrays), may refer to one or more memory arrays, whereas a "plurality of" is intended to refer to more than one of such things. Furthermore, the words "can" and "may" are used throughout this application in a permissive sense, (e.g., having the potential to, being able to), not in a mandatory sense, (e.g., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and may have the same meaning, as appropriate to the context.

A "semiconductor material" may be the lowest material of silicon single crystal or silicon polycrystalline (polysilicon) material consisting of a silicon wafer or a silicon material deposited on another material, such as silicon on sapphire and/or silicon on insulator (SOI) such as oxide. "Forming" a material as used herein is intended to include depositing the material (e.g., as a layer) using a suitable deposition technique, as used in the semiconductor industry. A "material" as used herein is intended to include a number of chemical elements and/or a combination of a plurality of chemical elements, and various numbers of each chemical element (e.g., to form a chemical compound), that may be used to form the material (e.g., by depositing the material as a layer). A "sub-material" as used herein is a subordinate material of the term "material." For example, a layer may include a plurality of sub-materials.

Ordinal numbers such as first, second, and third are used herein to assist in correlating and/or distinguishing between similar and/or selectably coupled components (e.g., materials and/or voltages) and are not used to indicate a particular ordering and/or relationship between the components, unless the context clearly dictates otherwise (e.g., by using terms such as adjacent, etc.).

The figures herein follow a numbering convention in which the first digit or digits correspond to the figure number and the remaining digits identify an element or component in the drawing. Similar elements or components between different figures may be identified by the use of similar digits. For example, 220 may reference element "20" in FIG. 2, and a similar element may be referenced as 420 in FIG. 4. Elements shown in the various embodiments herein may be added, exchanged, and/or eliminated so as to provide a number of additional embodiments of the present disclosure. In addition, the proportion and the relative scale of the elements provided in the figures are intended to illustrate certain embodiments of the present invention, and should not be taken in a limiting sense.

FIG. 1 is a block diagram of an apparatus in the form of a computing system 100 described in a number of embodiments of the present disclosure. System 100 may be, for example, a computer system, a memory system, a hand-held device, a cell phone, etc. FIG. 1 illustrates an example of a memory hierarchy associated with electronic system 100. In this embodiment, the memory hierarchy may include levels L1 to L5. As an example, levels L1 to L5 may be defined by memory characteristics (e.g., access speed, cycle speed, data throughput, memory cell size, reliability, endurance, volatility, and/or memory-window size, etc.). For example, in going from level L1 to level L5, the access speed, the cycle speed, and/or the data throughput may progressively decrease, while the non-volatility and/or storage capacity of the memory type may increase.

The data access speed, for example, may be related to the read access time of the memory, which refers to the time it takes to ensure the binary ("1" or "0") state of a particular memory bit within a memory array (e.g., the higher the access speed, the lower the access time). The cycle time may refer to the time it takes to not only establish the binary memory state of a storage bit (either "1" or "0") through programming ("write" and/or "erase"), but also the time to ensure the memory state (e.g., the access time). Memory delay (e.g., memory latency) may refer to the time it takes for the memory bit to arrive at the processor node once the processor fetches the memory bit triggered by a unit of a clock cycle of the processor, for example. Memory bandwidth (e.g., memory throughput), for example, may be related to, and inversely proportional to, the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) is employed, for example, the processor may execute an assigned task (e.g. a specific function or program) faster and the performance of a system (e.g., digital system) may be improved.

Memory volatility may be related to two aspects of retention of the memory state of a memory bit. One aspect of retention may be the retention of a memory state when the power is available to the memory array, which refers to no re-writing (e.g., refreshing), such as re-establishing, the memory state is required during a time period. This aspect of retention may be longer for SRAM and shorter for DRAM. Therefore, DRAM may require frequent refreshing of a memory state even when the power is on for the memory array. The other aspect of memory retention, for example, may be the ability to retain a written (e.g., established) memory state of a bit when there is no power to the memory array. Memory state retention of this type may be about 10 years for some non-volatile memories of some SSDs (NROMs or NAND types of memory cells) and hard disk drives (HDDs) (magnetic tapes or disks).

When power is not provided the memory states of SRAMs and DRAMs may be lost. Therefore, these types of memories may be classified as volatile memories. For non-volatile memories, the lower the degree of volatility, the longer the memory retains data, and thus the greater the retention. For example, SDDs may, in general, be less non-volatile compared to HDDs, where HDDs may retain data for centuries in a properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NANDs, for example, may have at least one year of non-volatility for most of the applications for which such memories may employed.

Another property of memory may be the number of times memory binary states may be "written" or "programmed" (e.g., altered) during the life time of the electronic system. The SRAMs and DRAMs can, for example, withstand such alterations known as "endurance." Endurance limits of some NROMs, for example, may be about 10 million times, while those of some NAND Flash memories may be about 100,000 times to about one million times. This may limit the application of current NROMs and NANDs for L1, L2, and L3 memory applications, as described herein, besides their significantly slower cycle time compared to SRAMs and DRAMs.

Electronic system 100 may include a processor 106, such as a microprocessor, that may control electronic system 100. Processor 106 may include a memory 101, such as a logic memory, having L1-level memory (e.g., SRAM volatile memory). Processor 106 may also include a memory 102, such as a cache memory, that may have L2-level memory (e.g., SRAM volatile cache memory).

Advantages of SRAM may include, for example, high performance (e.g., high data throughput), and high endurance required for L1/L2-level functionality, and/or ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and/or volatility.

As shown in FIG. 1, memory 102 may be coupled to memory 103 and/or memory 104; memory 103 may be coupled to memory 104 and/or memory 105. The term "coupled" may include being directly coupled and/or directly connected with no intervening elements (e.g., by direct physical contact) or being indirectly coupled and/or connected with intervening elements.

Memory 103 (e.g., L3-level memory) may be a main memory (e.g., a working memory) and may include volatile memories such as DRAM. Advantages of DRAM, for example, may include relatively higher performance compared to non-volatile memories (e.g., read, write, and erase times of 10 ns or less), relatively small (e.g., an F×F of about 6 to about 8) one-transistor-one-capacitor memory cells, yielding higher capacity, and/or relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers (nm)), and/or volatile memory cells (e.g., data may need to be refreshed about every millisecond (ms)).

Memory 104 (e.g., L4-level memory) may be a storage memory (e.g., for storing data and/or code) and may have a memory level L4. L4-level memory may include non-volatile NOR memory, non-volatile NAND memory, and/or non-volatile NROM. In some embodiments, memory 104 may be referred to as a solid-state memory.

Advantages of NROM (e.g., NROM Flash) may include, for example, relatively high read performance (e.g., fast reads), non-volatile memory cells, relatively small (e.g., an F×F of about 6) random-access-one-transistor memory cells, multiple-bit-per cell storage capability, basic-input/output-system (BIOS) functionality, code storage capability, and/or fabrication (e.g., compatible with CMOS fabrication techniques). Disadvantages of NROM may include, for example, relatively slow writes, relatively high programming voltages, relatively low read/write endurance, and/or relatively poor durability.

Advantages of NAND (e.g., NAND Flash) may include, for example, small (e.g., an F×F of about 4) one-transistor memory cells with single-bit- and multiple-bit-per cell storage capability, non-volatile memory cells, and high storage capacity per $mm^2$ of silicon. Disadvantages of NAND may include, for example, relatively slow write speeds (e.g., about 1.0 to about 10 ns), relatively slow access (e.g., serial/parallel memory access), and relatively low write/erase (W/E) endurance (e.g., about $10^3$ to about 106 W/E cycles).

Memory 105 (e.g., L5-level memory) may be a storage memory (e.g., for storing data and/or code). Memory 105 may be coupled to memory 103 (e.g., L3-level memory), and the data stored in memory 105 may be accessed and/or transferred to, for example, memory 103 such that the memory 103 as a main memory may utilize the data transferred from the memory 105. L5-level memories may include magnetic memory (e.g., magnetic tapes) and/or optical memory (e.g., optical discs) for storing data. In some embodiments, memory 105 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy may advantageously employ, for example, the memories described herein, such as the L1- to L5-level memories to fulfill system functionality objectives with cost, capability, power, performance, form-factor, portability, and/or applications in mind. The hierarchy may require communication between various memories and, therefore, for example, may disadvantageously involve a significant amount of peripheral logic, power, cost, performance compromises, form-factor constraints, reliability issues, and/or durability issues. This, for example, may suggest a "one-type-fits-all" approach to memory design (e.g., a novel one-type-fits-all memory). Except for HDD, some processors and memories may be silicon based, and the memory cell structure may be similar and may be built using scaled CMOS technology, for example.

One type of memory cell that satisfies the speed, power, and/or capacity capabilities of L1-, L2-, L3-, L4-, and L5-level memories may be useful. For example, unified technology integration with CMOS logic, such as unified fabrication techniques (e.g., that may be compatible with CMOS fabrication techniques) may be used. There may be a desire, for example, for scalable and lower-power memories (e.g., memory cells) with higher reliability and durability.

There may be a desire for all memories to maintain the information or data when there is a loss of power. There may be a desire, for example, to replace previous memory hierarchy in favor of a non-hierarchical organization that may result in faster communication with the processor.

Previous memory requirements and selection, in general, may be based on application, capacity, power requirements, cost, portability, form factor, and/or system performance/execution requirements. Another parameter in selecting specific memory types and organizing memory use in a specific system, such as electronic system 100, may be data throughput, such as cycle time. For example, data throughput may depend on the intrinsic characteristics of the memory cell.

Cycle time, as described herein, may strongly impact the time it may take for the processor to fetch a specific bit of data from a specific memory array. Estimated cycle times may include about 0.5 nanoseconds (ns) to about 1.0 ns for SRAM, about 5.0 ns to about 20 ns for DRAM, about 50000 ns to about 100000 ns for NROM, and may be 1000,000 ns or greater for NAND.

The present disclosure describes memory that may include, for example, non-volatile memory cells in which an active element, such as a FET, may be integrated with a dielectric stack, which may store a charge. In some embodiments, such a memory may be referred to as silicon-based-unified memory (SUM), such as uni-functional SUM (USUM). In some embodiment, the design of the dielectric stack may be varied so that the non-volatile memory cell (e.g., a USUM memory cell) may operate as an L1-, L2-, L3-, L4-, or L5-level memory cell. For example, the memory cells disclosed herein may have higher performance, lower power consumption, and/or higher reliability compared to NVM cells in previous approaches.

In some embodiments, FET-based USUM devices may be designed to achieve different functionality, dependent on intrinsic dielectric stack characteristics of a design, by adding or subtracting dielectrics in the dielectric stack. USUM technology may be integrated with the CMOS logic technology unlike some other memories, for example, such as DRAM, that may have unique customized integration requirements. USUMs may be differentiated by the attributes of their charge transport, charge storage, and charge retention (e.g., charge blocking) characteristics. For example, the intrinsic memory cell attributes may be different in terms of programming speed, power, and refresh requirements that may result in cycle-time variations, variations in data throughput and system capability, and differing applicability.

In some embodiments, some USUMs may have a programming voltage of about 5.0 volts to about 7.5 volts (e.g., compared to about 12 volts or higher for some NROMs and NANDs) and a programming speed of 100 microseconds (us) or less for two bits per memory cell (e.g., compared to about 1,000 us for one bit per cell for some NROMs). Some USUMs may have an energy consumption of about 50 times less than some NROMs, for example.

Some DRAMs may operate at 1.5 volts and may need to be refreshed about every 10 milliseconds (ms), for example. However, some USUMs, for example, may only need to be reprogrammed every 10 seconds or longer. Some DRAM memory cells, for example, may require twice as much area as some USUMs In a number of embodiments, SUM-memory-cell fabrication may be compatible with CMOS fabrication techniques. This may allow, for example, the dielectric stack to be fabricated to a desired memory level (L1, L2, L3, L4, and/or L5) with a reduced number of additional processing steps. Moreover, the SUM memory cells may be scalable to about a five-nanometer feature size. For example, such scaling may be difficult for DRAM designs in previous approaches.

USUM memory cells may be implemented (e.g., in scaled silicon) using, for example, CMOS logic technology and a set of unified and complimentary integration schemes that may replace some separate, custom-integration technology practices, such as those currently employed for DRAM (e.g., for L3), and NROM (for code, BIOS, etc.) and NAND-Flash ((e.g., for L4) memory chips. USUM memory cell technology may add or subtract specific selected dielectrics (e.g., as thin films) in the gate stack design in a unified process integration methodology with the scaled CMOS logic technology to enable functionality equivalence from L1 through L5. This may potentially have, for example, multiple benefits, such as technology compatibility, productivity, enhancement in technology reliability, reduction (e.g., elimination) of interfacing technology and packaging between different memory types and between logic and memories and/or additional test requirements. For example, potential benefits at the system level may include not only process complexity reduction, but also, cost reduction, power reduction, enhancements in performance, and/or reliability.

Multiple and wide-ranging memory cell performance and associated data throughput from the memory array may be built into the same USUM cell design. For example, this may be achieved by integrating dielectrics with well-defined intrinsic attributes into the dielectric stack design of an USUM memory cell while using a similar (e.g., the same) technology integration scheme. This may provide, for example, certain functionality and memory capability within a single memory array design.

USUMs may allow for similar memory cell designs and array architectures throughout the memory hierarchy that may provide a spectrum of cycle time, latency targets, and/or data throughput to deliver varying functionality requirements that may be balanced for certain applications. Due to the process commonality, USUM-cell designs may be implemented in different capacity arrays and or subarrays within a single chip or multiple chips to address system cost, power, form-factor, performance, and/or durability objectives. This may provide more flexibility in system design, for example.

Some USUM memory cell designs may employ an energy-efficient direct tunneling mechanism to achieve desired system performance and functionality. For example, this approach may allow voltage scalability for programming memory cells, and, consequently, power savings, that may be difficult to achieve using memory designs in previous approaches.

Band-engineered USUM memory cells may employ stack design and tailored programming to establish targeted speed-retention tradeoffs towards achieving the system data-rate throughput (L1/L2/L3/L4/L5 functionality) for effective execution of functions. For example, this approach may reduce data transmission delays, and thus increase data availability, at appropriate processing nodes, reduce pre-fetch data storage requirements, reduce machine cycle time for execution of functions, reduce data refresh requirements, reduce complexity in bus design, etc.

USUM-memory-cell designs may provide, for example, unique sets of functional attributes via dielectric stack designs for FET-based charge-trap memory cells. For example, the USUM memory cell and array design may have the potential to create superior digital systems.

FIGS. 2A-2D illustrate examples of a transistor and memory cells in accordance with a number of embodiments of the present disclosure. Each dielectric in the transistor and/or memory cells described in connection with FIG. 2A-2D is analogous to a "material." For example, a blocking dielectric 240 as described in connection with FIG. 2B may be also referred to as a blocking material (e.g., blocking material 340 as described in connection with FIG. 3) as further described in connection with FIGS. 3-5.

Figure 2A:
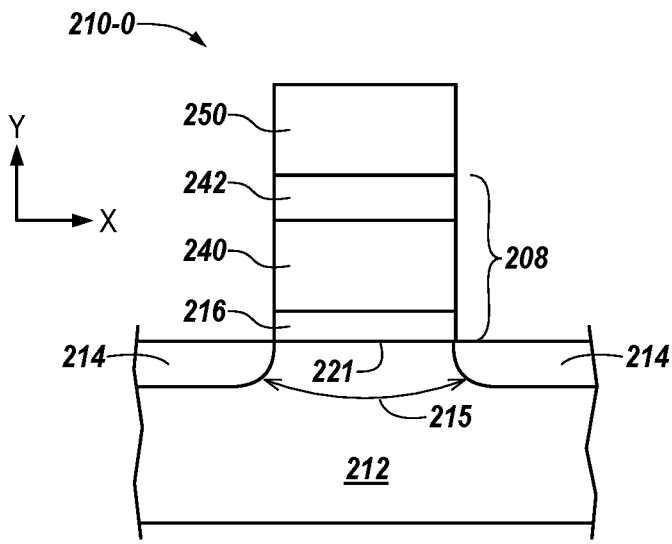
FIG. 2A illustrates an example of a transistor in accordance with a number of embodiments of the present disclosure.

FIG. 2A illustrates an example of a (e.g., scaled) transistor 210-0, such as a FET, that may be a (e.g., CMOS) logic transistor, for example, in accordance with a number of embodiments of the present disclosure. Transistor 210-0 may be formed on a semiconductor material 212, such as P-type (e.g., P⁻-doped) single crystal silicon substrate. Source/drains 214 (e.g., n⁺-type diffusion regions) may be formed on or in semiconductor material 212. Transistor 210-0 may include a (e.g., memory cell-compatible) dielectric stack 208 formed on the semiconductor material 212 and source/drains 214. A control gate 250 may be formed on the dielectric stack 208, and can, for example, be metal (e.g., tungsten, aluminum, etc.), or polysilicon (e.g., doped polysilicon, such as n⁺-doped polysilicon), etc., with an appropriate interface metallic, such as interface metallic 242, between the dielectric stack 208 and control gate 250 to achieve a desired value of a threshold of the FET.

In some embodiments, dielectric stack 208 may include an interface dielectric 216 (e.g., formed from oxygen-rich silicon oxynitride (OR-SiON) having a dielectric constant (K) of about 5.0) formed on the semiconductor material 212 and source/drains 214. As used herein, oxygen-rich may refer to an atomic percent being 55 or greater, and SiON may be a dielectric of oxy-nitride family. Interface dielectric 216 may act as a silicon-interface dielectric, such as a part of a gate dielectric, of transistor 210-0, for example. A blocking dielectric 240 (e.g., formed from hafnium tantalum oxynitride (HfTaON) having a K of about 18) may be formed on the interface dielectric 216 and together with interface dielectric 216 may form a double material gate dielectric for the FET. In some embodiments, the blocking dielectric 240 formed on the interface dielectric 216 may be high-K and/or low-leakage non-trapping material. The interface metallic 242 (e.g., tantalum nitride (TaN)) may be formed on the blocking dielectric 240. The control gate 250 may, for example, be formed on the interface metallic 242, and interface metallic 242 may act as a barrier between control gate 250 and blocking dielectric 240. In some embodiments, interface metallic 242 may act to create, at least in part, the threshold of transistor 210-0 by controlling the metal-insulator work function of a gate stack of transistor 210-0 that may include, for example, interface dielectric 216, blocking dielectric 240, interface metallic 242, and control gate 250.

The interface dielectric 216 may, for example, be about 1.0 nm to about 1.5 nm thick, and the blocking dielectric 240 may be about 6.0 nm thick. The thicknesses herein may be in the y-direction, such as the direction from an upper (e.g., topmost) surface 221 of semiconductor material 212, that is perpendicular to the x-direction, such as the direction from one source/drain 214 to the other source/drain 214. For example, during operation of a transistor 210-0 or the memory cells 210-0 that is further described in connection with FIGS. 2B, 2C, and 2D, a channel 215 may be formed in semiconductor material 212 between source/drains 214 that may be parallel to the x-direction and perpendicular to the y-direction that may be parallel to the planar surface of silicon. It should be recognized the terms perpendicular and parallel respectively account for variations from "exactly" perpendicular and "exactly" parallel due to routine manufacturing, measuring, and/or assembly variations.

Figure 2B:
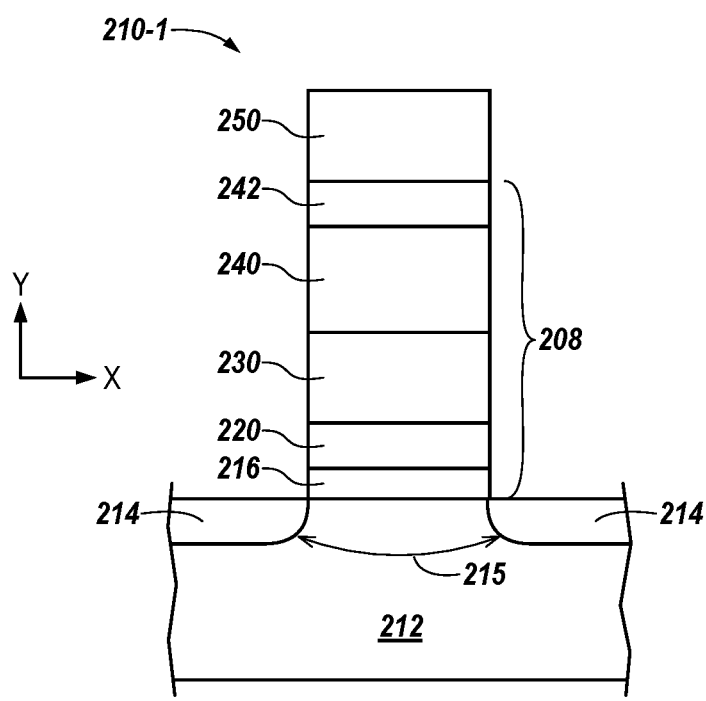
FIG. 2B illustrates an example of a non-volatile memory cell in accordance with a number of embodiments of the present disclosure.

FIG. 2B illustrates an example of a non-volatile memory cell 210-1 in accordance with a number of embodiments of the present disclosure. FIG. 2B illustrates an example of a gate stack structure of non-volatile memory cell 210-1. In the example of FIG. 2B, additional dielectrics may be added to the dielectric stack 208 of transistor 210-0 as described in connection with FIG. 2A to form a non-volatile dielectric stack 208 (e.g., extending in the y-direction from the upper surface 221 of semiconductor material 212) of memory cell 210-1 to store a charge. In some embodiments, memory cell 210-1 may be used as an L1-level memory cell, such as an L1-level USUM cell (e.g., that may replace a SRAM memory cell, such as in memory 101 in FIG. 1). In other embodiments, memory cell 210-1 may be used as an L2-level memory cell, such as an L2-level USUM cell (e.g., that may replace a SRAM memory cell, such as in memory 102 in FIG. 1). For example, Table 1 provides an example of a dielectric stack 208 for an L1/L2-level memory cell (e.g., that may be optimized for programming speed).

TABLE 1

Example of a dielectric stack 208 (FIG. 2B) for an L1/L2-Level Memory Cell

| Interface dielectric 216 | Tunnel Dielectric 220 | Charge trapping material 230 | Blocking Dielectric 240 |
|---|---|---|---|
| OR-SiON 1 nm | HfTaON 2 nm | GaN 4 nm | HfTaON 6 nm |

Dielectric stack 208 may include, for example, the interface dielectric 216 that may act as an interface tunnel dielectric of memory cell 210-1. For example, interface dielectric 216 may be about 1.0 nm thick. In a number of embodiments, interface dielectric 216 may be formed from OR-SiON.

A tunnel dielectric 220, such as HfTaON, may be formed on the interface dielectric 216 in dielectric stack 208. For example, the tunnel dielectric 220 may be about 2.0 nm thick for memory cell 210-1 (e.g., an L1/L2-level memory cell). A charge trapping material 230, such as GaN having a K of about 10, may be formed on the tunnel dielectric 220 and, for example, may have a thickness of about 4.0 nm.

The blocking dielectric 240, as described in connection with FIG. 2A, may be formed on the charge trapping material 230 in dielectric stack 208. The interface metallic 242, as described in connection with FIG. 2A, may be formed on the blocking dielectric 240. The control gate 250, as described in connection with FIG. 2A, may be formed on the interface metallic 242. Interface metallic 242, for example, may act to create, at least in part, a threshold of memory cell 210-1 by controlling the metal-insulator work function of a gate stack of memory cell 210-1 that may include, for example, the dielectric stack 208, interface metallic 242, and control gate 250.

In some embodiments, such as the example of Table 1, the effective oxide thickness (EOT) of dielectric stack 208 may be about 4.0 nm, where the EOT is the thickness that silicon dioxide (SiO₂) would need to be to have the capacitance of a material or stack of materials. For example, a dielectric stack 208 having an EOT of about 4.0 nm means that the capacitance of dielectric stack 208 may the capacitance of about 4.0 nm of SiO₂. The EOT of the combined tunnel dielectrics (e.g., including the interface dielectric 216 and the tunnel dielectric 220), such as for the example of Table 1, may be about 1.3 nm (e.g., about 1.25 nm).

The program/erase time for a memory cell 210-1 (e.g., having the dielectric stack 208 in the example of Table 1) may, for example, be 25 ns or less for a program/erase voltage of about ±3.0 V. Such a (e.g., fast) programming speed may be achieved, at least in part, through internal field enhancement of direct tunneling electrons after the electronic charges tunnel through the interface dielectric 216 and are accelerated due to the conduction band energy lowering (band energy offset) of the (e.g., direct) tunnel dielectric 220. For example, this may be called a progressive band offset (PBO) SUM stack design for the tunneling part of the stack 208.

In some embodiments, such as for the embodiment described in Table 1, the initial memory window of memory cell 210-1 may be about 2.0 V, and the end-of-life memory window may be about 1.0 V. In the embodiment described in Table 1, the end-of-life endurance of memory cell 210-1 may be greater than about 10 billion write/erases, compared to previous approaches (e.g., a million write/erases). Further, the retention of memory cell 210-1 may be on the order of hours. Further, the peak write/erase field (e.g., a measure of the charge transport energy) of memory cell 210-1 may be 7.5 megavolts (MV)/centimeter (cm) or less, compared to previous approaches (e.g., about 12.0 MV/cm to about 15.0 MV/cm).

The non-volatile memory cell 210-1 may be created from the basic transistor 210-0 shown and described in connection with FIG. 2A by adding tunnel dielectric 220 and charge trapping material 230 to the dielectric stack 208 of transistor 210-0 to create the dielectric stack 208 of memory cell 210-1 in FIG. 2B. For example, non-volatile memory cell 210-1 in FIG. 2B may be said to be FET-based.

Dielectric stack 208 may be modified, in some embodiments, by introducing a (e.g., an ultra-thin) storage dielectric (e.g., about 1.0 to 1.5 nm of injector silicon-rich nitride (In-SRN)) between tunnel dielectric 220 and charge trapping material 230. The role of such a storage dielectric (e.g., and In-SRN) is further discussed.

Figure 2C:
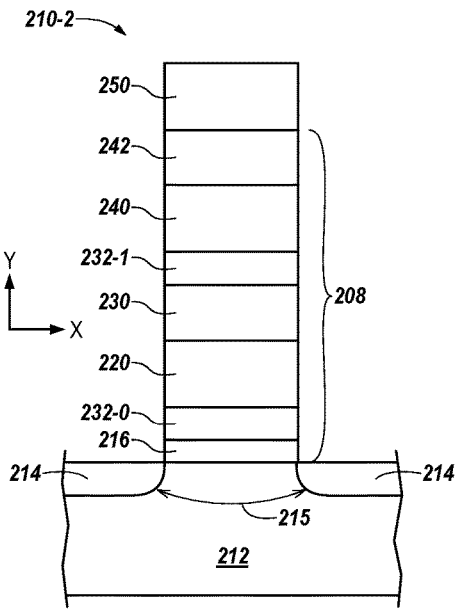
FIG. 2C illustrates another example of a non-volatile memory cell in accordance with a number of embodiments of the present disclosure.

FIG. 2C illustrates an example of a non-volatile memory cell 210-2 in accordance with a number of embodiments of the present disclosure. For example, FIG. 2C illustrates an example of a gate stack structure of non-volatile memory cell 210-2 (e.g., structured to meet intended functionality of a working memory with extended refresh time). In the example of FIG. 2C, additional dielectrics may be added to the dielectric stack 208 of transistor 210-0 as described in connection with FIG. 2A to form a non-volatile dielectric stack 208 (e.g., extending in the y-direction from the upper surface 221 of semiconductor material 212) of memory cell 210-2 to store a charge. In some embodiments, memory cell 210-2 may be used as an L3-level memory cell, such as an L3-level USUM cell (e.g., that may replace a DRAM volatile memory cell, such as in memory 125 in FIG. 1). For example, Table 2 provides an example of a dielectric stack 208 for an L3-level memory cell.

TABLE 2

Example of a dielectric stack 208 (FIG. 2C) for an L3-Level Memory Cell

| Interface dielectric 216 | Storage Dielectric 232-0 | Tunnel Dielectric 220 | Charge trapping material 230 | Storage Dielectric 232-1 | Blocking Dielectric 240 |
|---|---|---|---|---|---|
| OR-SiON 1-1.5 nm | In-SRN 1 nm | HfLaON 3 nm | GaN 5 nm | In-SRN 3 nm | HfLaON 6 nm |

Dielectric stack 208 may include, for example, the interface dielectric 216 (e.g., that may act as an interface tunnel dielectric of memory cell 210-2) formed one the semiconductor material 212 and source drains 214, except that the thickness of dielectric 216 may be about 1.0 nm to about 1.5 nm for the L3-level memory cell 210-2, as opposed to about 1.0 nm for the L1/L2-level memory cell 210-1. A (e.g., an ultra-thin) storage dielectric 232-0 (e.g., silicon-rich nitride (SRN) that may contain silicon nano-particles in nitride) may be formed on the interface dielectric 216 in dielectric stack 208. For example, storage dielectric 232-0 may be about 1.0 nm thick and may have silicon nano-particles (e.g., with a diameter of about 1.0 nm) in nitride that may be closely spaced.

Storage dielectric 232-0 may be referred to as an injector dielectric (e.g., In-SRN). For example, the storage dielectric 232-0 may act as an internal "electro-static-potential-modulator." In some embodiments, storage dielectric 232-0 may temporarily store some electronic charge and may act as a barrier to reduce charge leakage from memory cell 208 to the silicon material during the higher threshold standby state of the memory cell. Thereby, such a dielectric stack design may extend the refresh time for the L3 functionality.

A tunnel dielectric 220, such as hafnium lanthanum oxynitride (HfLaON) having a K of about 20, may be formed on the storage dielectric 232-0 in dielectric stack 208. However, embodiments are not so limited. For example, tunnel dielectric 220 may be formed from HfTaON and, for example, may have a thickness of about 3.0 nm for memory cell 210-2 (e.g., an L3-level memory cell). A charge trapping material 230, such as GaN, may be formed on the tunnel dielectric 220 and, for example, may have a thickness of about 5.0 nm. The charge trapping material 230 described in connection with Table 2 of FIG. 2C may be a thicker than that of the charge trapping material 230 described in connection with Table 1 of FIG. 2B.

A storage (e.g., charge storage reservoir) dielectric 232-1 (e.g., In-SRN) may be formed on the charge trapping material 230 in dielectric stack 208. For example, storage dielectric 232-1 may be about 3.0 nm thick. Storage dielectric 232-1 may act as a storage reservoir and may store charge (e.g., from semiconductor material 212) in addition to charge trapping material 230, and may thus act to increase the memory window. The trap depth of charge trapping material 230 may be greater than storage dielectric 232-1 and thus greater energy may be required to free charges from charge trapping material 230 than from storage dielectric 232-1. Charges stored in (e.g., a silicon nano-crystal potential well within) the storage dielectric 232-0 (e.g., where the thickness of storage dielectric 232-0 may be about the same as the silicon nano-crystal diameter) may generate a negative electrostatic potential. Thus, storage dielectric 232-0 may act to cause a reduction in the reverse tunneling field generated due to the combined electronic charges stored in the charge trapping material 230 and the storage dielectric 232-1 (e.g., that may be due to prior writing of the memory cell), such as during a standby state of the memory.

A blocking dielectric 240, such as HfLaON, may be formed on storage dielectric 232-1 in dielectric stack 208. However, embodiments are not so limited. For example, blocking dielectric 240 may be HfTaON and about 6.0 nm thick. The interface metallic 242, as described in connection with FIG. 2A, may be formed on the blocking dielectric 240. The control gate 250, as described in connection with FIG. 2A, may be formed on the interface metallic 242. Interface metallic 242, for example, may act to create, at least in part, a threshold of memory cell 210-2 by controlling the metal-insulator work function of a gate stack of memory cell 210-2 that may include, for example, the dielectric stack 208, interface metallic 242, and control gate 250.

In a number of embodiments, such as the embodiments shown in Table 2, the EOT of the dielectric stack of the resulting L3-level non-volatile memory cell may be about 6.0 nm; the EOT of the combined tunnel dielectrics (e.g., including the interface dielectric 216 and the tunnel dielectric 220) may be 1.5 nm or less; and/or the program/erase time of the resulting L3-level non-volatile memory cell may be 100 ns or less for a program/erase voltage of about ±4.5 V. Moreover, the resulting L3-level non-volatile memory cell such as the embodiments described in Table 2 may have an end-of-life endurance of greater than 1000 billion write/ erases, a retention on the order of days, and/or a peak write/erase field of 7.5 MV/cm or less. The initial memory window of the resulting L3-level non-volatile memory cell such as the embodiments described in Table 2 may be 3.0 V or greater, and/or the end-of-life memory window may be 1.5 V or greater.

Altering the dielectric stack 208 as described in connection with FIG. 2B to create the dielectric stack 208 as described in connection with FIG. 2C may change the L1/L2 functionality of memory cell 210-1 in FIG. 2B to the L3 functionality of memory cell 210-2 in FIG. 2C. This may be an advantageous characteristic of USUM technology. For example, the storage dielectrics 232-0 and 232-1, the tunnel dielectric 220, and the blocking dielectric 240 in dielectric stack 208 may act to produce the increased retention and memory window of memory cell 210-2 at the expense of the speed (e.g., program/erase time) compared to the stack design option for the memory cell 210-1.

The non-volatile memory cell 210-2 may be created from the basic transistor 210-0 as described in connection with FIG. 2A by adding storage dielectric 232-0, tunnel dielectric 220, charge trapping material 230, and storage dielectric 232-1 to the dielectric stack 208 of transistor 210-0 as described in connection with FIG. 2A and replacing blocking dielectric 240 as described in connection with FIG. 2A in the dielectric stack 208 of transistor 210-0 with blocking dielectric 240 as described in connection with FIG. 2C to create the dielectric stack 208 of memory cell 210-2. For example, non-volatile memory cell 210-2 may be said to be FET-based. This may be an advantageous characteristic of USUM technology.

Figure 2D:
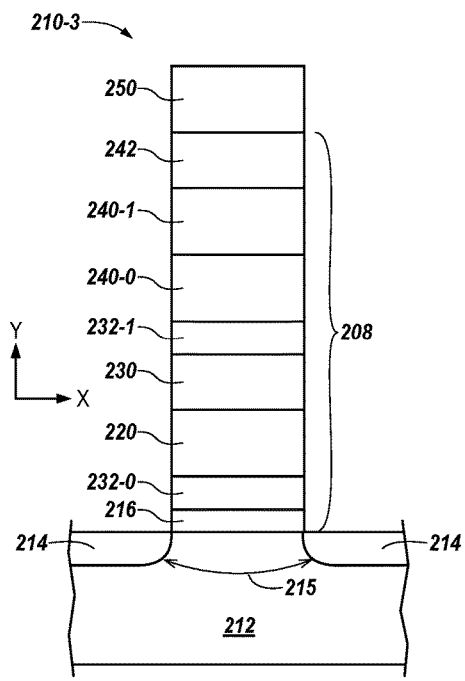
FIG. 2D is an example of a non-volatile memory cell of a dielectric stack in accordance with a number of embodiments of the present disclosure.

FIG. 2D illustrates an example of a non-volatile memory cell 210-3 in accordance with a number of embodiments of the present disclosure. For example, FIG. 2D illustrates an example of a gate stack structure of non-volatile memory cell 210-3. As shown in FIG. 2D, additional dielectrics may be added to the dielectric stack 208 of transistor 210-0 as described in FIG. 2A to form a non-volatile dielectric stack 208 (e.g., extending in the y-direction from the upper surface 221 of semiconductor material 212) of memory cell 210-3 to store a charge. In some embodiments, memory cell 210-3 may be an L4-level memory cell, such as an L4-level USUM cell, that may replace NAND non-volatile memory cells (e.g., to store data) and/or NROM non-volatile memory cells (e.g., to store code and/or to perform BIOS functions). For example, Table 3 illustrates an example of a dielectric stack 208 for an L4-level memory cell.

Dielectric stack 208 may include, for example, the interface dielectric 216 (e.g., as described in connection with Table 2 of FIG. 2C that, for example, may act as an interface tunnel dielectric of memory cell 210-2) formed on the semiconductor material 212 and source/drains 214, the storage dielectric 232-0 formed on the interface dielectric 216, the tunnel dielectric 220 formed on the storage dielectric 232-0, and the charge trapping material 230 formed on the tunnel dielectric 220.

A storage dielectric 232-1 (e.g., that may be about 5.0 nm thick), such as In-SRN, may be formed on the charge trapping material 230. The storage dielectric 232-1 may be a thicker than that of the storage dielectric 232-1 described in connection with Table 2 of FIG. 2C. Storage dielectric 232-1 may act as a storage reservoir and may store charge in addition to charge trapping material 230, and may thus act to increase the memory window. A blocking dielectric 240-0 may be formed on the storage dielectric 232-1 in dielectric stack 208. In some embodiments, blocking dielectric 240-0 may be aluminum oxide ($Al_2O_3$) having a K of about 10 and, for example, a thickness of about 4.0 nm.

In embodiments where the blocking dielectric 240-0 includes $Al_2O_3$, the $Al_2O_3$ may react with the storage dielectric 232-1 (e.g., the In-SRN) to provide a (e.g. relatively high density of) fixed (e.g., to within routine variations) negative charge at the mutual interface of storage dielectric 232-1 and blocking dielectric 240-0. This fixed negative charge along with the (e.g., relatively) high barrier electronic energy of the $Al_2O_3$ conduction band provides a (e.g., significantly) larger memory window of the memory cell as well as enhanced retention due to reduced leakage of charges to the control gate 250.

The blocking dielectric 240-1 may be formed on the blocking dielectric 240-0 in dielectric stack 208. The interface metallic 242 may be formed on the blocking dielectric 240-1. The control gate 250 may be formed on the interface metallic 242. Interface metallic 242, for example, may act to create, at least in part, a threshold of memory cell 210-3 by controlling the metal-insulator work function of a gate stack of memory cell 210-3 that may include, for example, the dielectric stack 208, interface metallic 242, and control gate 250.

In a number of embodiments, such as the embodiment described in Table 3, the EOT of dielectric stack 208 may be about 9.5 nm; the EOT of the combined tunnel dielectrics 220 and 220 may be about 2.0 nm; and/or the program/erase time of memory cell 210-3 may be 10,000 ns or less for a program/erase voltage of about ±6.0 V. Moreover, memory cell 210-3 such as the embodiments described in Table 3 may have an end-of-life endurance of 10 billion write/erases or more, a retention of 10 years or more, and/or a peak write/erase field of 7.5 MV/cm or less. The initial memory window of memory cell 210-3 such as the embodiments

TABLE 3

Example of a dielectric stack 208 (FIG. 2D) for an L4-Level Memory Cell

| Interface dielectric 216 | Storage Dielectric 232-0 | Tunnel Dielectric 220 | Charge trapping material 230 | Storage Dielectric 232-1 | Blocking Dielectric 240-0 | Blocking Dielectric 240-1 |
|---|---|---|---|---|---|---|
| OR-SiON 1-1.5 nm | In-SRN 1 nm | HfLaON 3 nm | GaN 5 nm | In-SRN 5 nm | $Al_2O_3$ 4 nm | HfLaON 6 nm | described in Table 3 may be 6.0 V or greater, and the end-of-life memory window may be 4.0 V or greater.

Altering the dielectric stack 208 as described in connection with FIG. 2B to create the dielectric stack 208 as described in connection with FIG. 2D may change the L1/L2 functionality of memory cell 210-3 to the L4 functionality of memory cell 210-3. This may be an advantageous characteristic USUM technology. For example, the storage dielectrics 232-0 and 232-1, the tunnel dielectric 220, and/or the blocking dielectric 240-1 in dielectric stack 208 may act to produce the increased retention and/or increased memory window of memory cell 210-3 at the expense of the speed (e.g., program/erase time) of memory cell 210-2. Moreover, altering the dielectric stack 208 as described in connection with FIG. 2C to create dielectric stack 208 as described in connection with FIG. 2D may change L3 functionality of memory cell 210-2 to the L4 functionality of memory cell 210-3. For example, the storage dielectric 232-1 and the blocking dielectric 240-0 may act to produce the increased retention and increased memory window of memory cell 210-3 compared to memory cell 210-2. The increased memory window may provide, for example, the capability of multi-level storage within the memory cell, thus enhancing the memory storage (e.g., causing the memory storage capacity to be doubled or tripled).

Non-volatile memory cell 210-3 may be created from the basic transistor 210-0 by adding storage dielectric 232-0, tunnel dielectric 220, charge trapping material 230, storage dielectric 232-1, and blocking dielectric 240-0 to the dielectric stack 208 of transistor 210-0 and replacing blocking dielectric 240 in the dielectric stack 208 of transistor 210-0 with blocking dielectric 240-1 as described in connection with FIG. 2D to create the dielectric stack 208 of memory cell 210-3. In some embodiments, the dielectric stacks described in connection with FIGS. 2A-2D (e.g., dielectric stacks 208 as described in connection with FIGS. 2A-2D) may be formed by a single machine (e.g., a single low-pressure-chemical-vapor-deposition (CVD) system) that may reduce fabrication cost.

In some embodiments, an integration scheme may be adopted that would define the L1/L2-, L3-, and L4-level non-volatile memory array regions. Interface dielectric 216 may be formed in the defined L1/L2-memory region (e.g., concurrently) with forming (e.g., a thickness of) interface dielectric 216 in the L3- and L4-level memory array regions (e.g., over semiconductor material 212). Subsequently, the L1/L2-level memory array region (e.g., interface dielectric 216 in the L1/L2-level memory array region) may be protected while an additional thickness of interface dielectric 216 is formed (e.g., concurrently) in the L3- and L4-level memory array regions, if desired (e.g., over the thickness of interface dielectric 216 previously formed in the L3- and L4-level memory array regions).

As used herein, multiple acts being performed concurrently is intended to mean that each of these acts is performed for a respective time period, and each of these respective time periods overlaps, in part or in whole, with each of the remaining respective time periods. In other words, those acts may concurrently performed for at least some period of time.

Storage dielectric 232-0 may be formed (e.g., over interface dielectric 216) in the L3- and L4-level memory array regions (e.g., concurrently) while protecting (e.g., interface dielectric 216 in) the L1/L2-level memory array region. Tunnel dielectric 220 may be formed (e.g., over interface dielectric 216) in the L1/L2-level memory array region while protecting (e.g., storage dielectric 232-0 in) the L3- and L4-level memory array regions. Tunnel dielectric 220 may be formed (e.g., concurrently) in the L3- and L4-level memory array regions (e.g., over storage dielectric 232-0) while protecting (e.g., tunnel dielectric 220 in) the L1/L2-level memory array region.

In other embodiments, tunnel dielectric 220 may be formed (e.g., over interface dielectric 216) in the L1/L2-level memory array region while protecting (e.g., interface dielectric 216 in) the L3- and L4-level memory array regions. Storage dielectric 232-0 may be formed (e.g., over interface dielectric 216) in the L3- and L4-level memory array regions (e.g., concurrently) while protecting (e.g., tunnel dielectric 220 in) the L1/L2-level memory array region. Tunnel dielectric 220 may be formed (e.g., over storage dielectric 232-0) in the L3- and L4-level memory array regions (e.g., concurrently) while protecting (e.g., tunnel dielectric 220 in) the L1/L2-level memory array region.

Charge trapping material 230 may be formed in the L1/L2-level memory array region (e.g., over tunnel dielectric 220) while (e.g., concurrently) forming (e.g., a thickness of) charge trapping material 230 in the L3- and L4-level memory array regions (e.g., over tunnel dielectric 220). The process may be repeated by protecting (e.g., charge trapping material 230 in) the L1/L2-level memory array region while an additional thickness of charge trapping material 230 is formed (e.g., over the thickness of charge trapping material 230 previously formed in) the L3- and L4-level memory array regions to form charge trapping material 230.

Storage dielectric 232-1 may be formed in the L3-level memory array while (e.g., concurrently) forming (e.g., a thickness of) storage dielectric 232-1 in the L4-level memory array region while protecting (e.g., charge trapping material 230 in) the L1/L2-level memory array region. The process may be repeated by protecting (e.g., charge trapping material 230 in) the L1/L2-level memory array region and by protecting (e.g., storage dielectric 232-1 in) the L3-level memory array region while an additional thickness of storage dielectric 232-1 is formed (e.g., over the thickness of storage dielectric 232-1 previously formed) in the L4-level memory array region to form dielectric 232-1.

Blocking dielectric 240 may be formed (e.g., over charge trapping material 230) in the L1/L2-level memory array region while protecting (e.g., storage dielectric 232-1 in) the L3-level memory array region and (e.g., storage dielectric 232-1 in) the L4-level memory array region. In some embodiments, (e.g., blocking dielectric 240 in) the L1/L2-memory array region and (e.g., storage dielectric 232-1 in) the L3-memory array region may be protected while forming blocking dielectric 240-0 (e.g., over storage dielectric 232-1) in the L4-level memory array region. Blocking dielectric 240-1 may be formed (e.g., concurrently) in the L4-level memory array region (e.g., over blocking dielectric 240-0) and (e.g., over storage dielectric 232-1) in the L3-level memory array region while protecting (e.g., blocking dielectric 240 in) the L1/L2-level memory array region. Interface metallic 242 may be formed (e.g., concurrently) in the L1/L2-memory regions (e.g., over blocking dielectric 240) and in the L3- and L4-level memory array regions (e.g., over blocking dielectric 240-1). Control gate 250 may be formed (e.g., concurrently) in the L1/L2-, L3-, and L4-level memory array regions (e.g., over interface metallic 242).

In some embodiments, (e.g., blocking dielectric 240 in) the L1/L2-level memory array region may be protected while forming (e.g., concurrently) blocking dielectric 240-1 in the L3-level memory array region (e.g., over storage dielectric 232-1) and the L4-level memory array region (e.g., over storage dielectric 232-1). (e.g., blocking dielectric 240 in) the L1/L2-level memory array region and (e.g., blocking dielectric 240-1 in) the L3-level memory array region may be protected while forming blocking dielectric 240-0 in the L4-level memory array region (e.g., over blocking dielectric 240-1). Interface metallic 242 may be formed (e.g., concurrently) in the L1/L2-memory regions (e.g., over blocking dielectric 240), in L3-level memory array region (e.g., over blocking dielectric 240-1), and L4-level memory array region (e.g., over blocking dielectric 240-0). Control gate 250 may be formed (e.g., concurrently) in L1/L2-, L3-, and L4-level memory array regions (e.g., over interface metallic 242).

In some embodiments, blocking dielectric 240-1 may be formed (e.g., concurrently) in the L3-level memory array region (e.g., over storage dielectric 232-1) and the L4-level memory array region (e.g., over storage dielectric 232-1) while protecting (e.g., charge trapping material 230 in) the L1/L2-memory array region. Blocking dielectric 240 may be formed (e.g., over charge trapping material 230) in the L1/L2-level memory array region while protecting (e.g., blocking dielectric 240-1 in) the L3- and L4-level memory array regions. Further, (e.g., blocking dielectric 240 in) the L1/L2-level memory array region and (e.g., blocking dielectric 240-1 in) the L3-level memory array region may be protected while forming blocking dielectric 240-0 in the L4-level memory array region (e.g., over blocking dielectric 240-1).

In some embodiments, (e.g., charge trapping material 230 in) the L1/L2-memory array region and (e.g., storage dielectric 232-1 in) the L3-memory array region may be protected while forming blocking dielectric 240-0 (e.g., over storage dielectric 232-1) in the L4-level memory array region. Blocking dielectric 240-1 may be formed (e.g., concurrently) in the L4-level memory array region (e.g., over blocking dielectric 240-0) and (e.g., over storage dielectric 232-1) in the L3-level memory array region while protecting (e.g., charge trapping material 230) the L1/L2-level memory array region. Blocking dielectric 240 may be formed (e.g., over charge trapping material 230) in the L1/L2-level memory array region while protecting (e.g., blocking dielectric 240-1 in) the L3- and L4-level memory array regions.

In some embodiments, (e.g., charge trapping material 230 in) the L1/L2-memory array region and (e.g., storage dielectric 232-1 in) the L3-memory array region may be protected while forming blocking dielectric 240-0 (e.g., over storage dielectric 232-1) in the L4-level memory array region. Blocking dielectric 240 may be formed (e.g., over charge trapping material 230) in the L1/L2-level memory array region while protecting (e.g., storage dielectric 232-1 in) the L3-memory array region and (e.g., blocking dielectric 240-0 in) the L3- and L4-level memory array regions. Blocking dielectric 240-1 may be formed (e.g., concurrently) in the L4-level memory array region (e.g., over blocking dielectric 240-0) and (e.g., over storage dielectric 232-1) in the L3-level memory array region while protecting (e.g., charge trapping material 230 in) L1/L2-level memory array region. Blocking dielectric 240 may be formed (e.g., over charge trapping material 230) in the L1/L2-level memory array region while protecting (e.g., blocking dielectric 240-1 in) the L3- and L4-level memory array regions.

In some embodiments, the relatively low peak write/erase fields of the dielectric stacks of the memory cells described in connection with FIGS. 2B-2D (e.g., 7.5 MV/cm or less compared with about 12.0 MV/cm to about 15.0 MV/cm for previous approaches) may result in the relatively large end-of-life endurance for the memory cells described herein (e.g., greater than 10 billion write/erases, compared to about a million write/erases for previous approaches). The program/write voltages of about ±3.0 V for the L1/L2-level memory cell, about ±4.5 V for the L3-level memory cell, and/or about ±6.0 V for the L4-level memory cell may be significantly lower than program/write voltage of at least about ±12 V for previous approaches, such as non-volatile NAND memory cells.

Figure 3A:
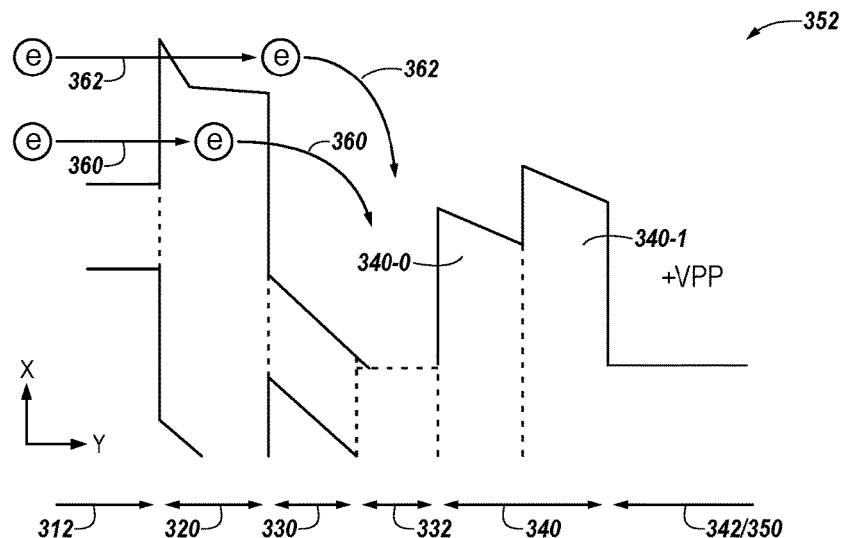
FIG. 3A illustrates an example of a programming pathway for transporting charges via a multi-mechanism charge transport in accordance with a number of embodiments of the present disclosure.

FIG. 3A illustrates an example of a programming pathway 352 for transporting charges via the multi-mechanism charge transport in accordance with a number of embodiments of the present disclosure. As shown in FIG. 3A, the programming pathway 352 includes a semiconductor material 312, and a tunneling material 320 adjacent to (e.g., formed on) the semiconductor material 312, a charge trapping material 330 adjacent to the tunneling material 320, a charge storage material 332 adjacent to the charge trapping material 330, and a charge blocking material 340 adjacent to the charge storage material 332, and an interface metallic material (e.g., analogous to the interface metallic 242 as described in FIG. 2)/metal gate 342/350 adjacent to the charge blocking material 340. Although embodiments are not so limited, the charge blocking material 340 may include a plurality of different materials (e.g., sub-materials). For example, the charge blocking material 340 may include a first charge blocking material 340-0 and a second charge blocking sub-material 340-1. In a number of embodiments, the first charge blocking sub-material 340-0 may be formed from hafnium dioxide ($HfO_2$) and the second charge blocking material 340-1 may be formed from HfLaON. The charge trapping material 330 may include GaN.

In this embodiment of the programming pathway 352, charges may be transported (e.g., for programming a memory cell including the programming pathway 352 to a target state) via the multi-mechanism charge transport such that charges (e.g., electrons) may be simultaneously transported to the charge trapping material 330 and the charge storage material 332 (e.g., In-SRN) adjacent to the charge trapping material 330, through a plurality of different channels. For example, the multi-mechanism charge transport may include transport of electrons from the semiconductor material 312 to the charge trapping material 330 and the charge storage material 332 via a direct tunneling (e.g., as shown by an arrow 360) simultaneously with transport of electrons from the semiconductor material 312 to the charge trapping material 330 and the charge storage material 332 via a F-N tunneling (e.g., as shown by an arrow 362).

Figure 3B:
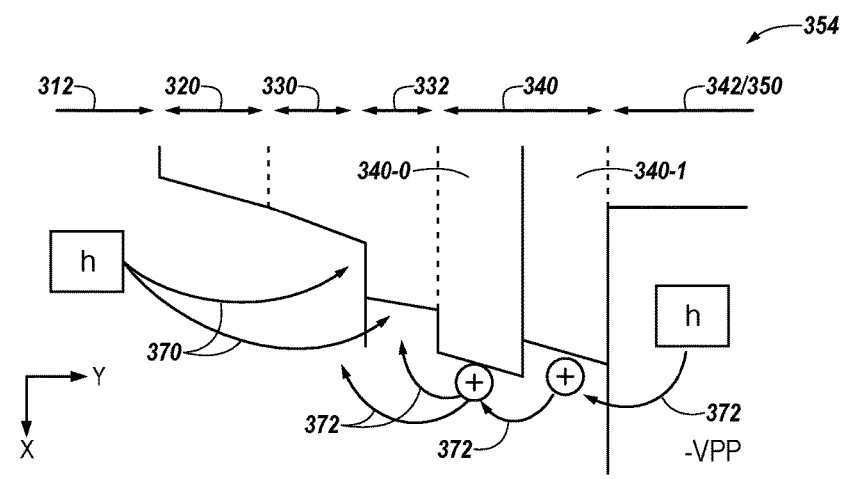
FIG. 3B illustrates an example of a programming pathway for transporting charges via the multi-mechanism charge transport in accordance with a number of embodiments of the present disclosure.

FIG. 3B illustrates an example of a programming pathway 354 for transporting charges via the multi-mechanism charge transport in accordance with a number of embodiments of the present disclosure. As shown in FIG. 3B, the programming pathway 354 includes a semiconductor material 312, and a tunneling material 320 adjacent to (e.g., formed on) the semiconductor material 312, a charge trapping material 330 adjacent to the tunneling material 320, a charge storage material 332 adjacent to the charge trapping material 330, a charge blocking material 340 adjacent to the charge storage material 332, and an interface metallic material/metal gate 342/350 adjacent to the charge blocking material 340. Although embodiments are not so limited, the charge blocking material 340 may include a plurality of different materials (e.g., sub-materials). For example, the charge blocking material 340 may include a first charge blocking material 340-0 and a second charge blocking sub-material 340-1. In a number of embodiments, the first charge blocking sub-material 340-0 may be formed from hafnium dioxide ($HfO_2$) and the second charge blocking material 340-1 may be formed from HfLaON. The charge trapping material 330 may include GaN.

In this embodiment of the programming pathway 354, charges may be transported (e.g., for programming a memory cell including the programming pathway 354 to an erased state) via the multi-mechanism charge transport such that charges (e.g., holes) may simultaneously transported to the charge trapping material 330 and the charge storage material 332 through a plurality of different channels. For example, the multi-mechanism charge transport includes transport of holes from the interface metallic material/the metal gate 342/350 (e.g., as shown by an arrow 372) simultaneously with transport of holes from the semiconductor material 312 to the charge trapping material 332 (as shown by an arrow 370).

In a number of embodiments, the programming pathways 352 and 354 as described in FIG. 3A and FIG. 3B may be implemented in programming transistor/memory cells 210-0, 210-1, 210-2, and/or 210-3. Transporting charges via the multi-mechanism charge transport provides benefits such as fast and/or energy-efficient programming operations (e.g., write/erasure operations), among others. For example, the programming operation (e.g., write operation) may be performed in 300 ns or less and/or the erase operation may be performed in 1 us or less for L4 level functionality.

Figure 4:
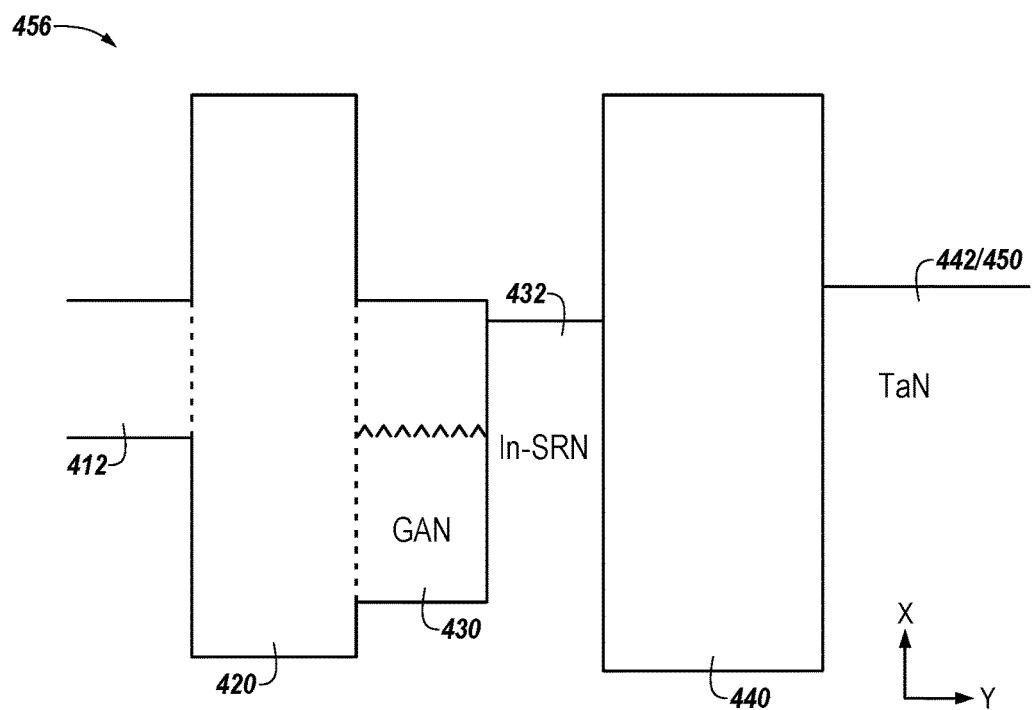
FIG. 4 illustrates an example of a programming pathway including a charge trapping material for transporting charges via the multi-mechanism charge transport in accordance with a number of embodiments of the present disclosure.

FIG. 4 illustrates an example of a programming pathway 456 including a charge trapping material for transporting charges via the multi-mechanism charge transport in accordance with a number of embodiments of the present disclosure. In a number of embodiments, during a programming operation (e.g., write operation), the multi-mechanism charge transport may include transporting low-energy electrons (e.g., cool electrons) from a semiconductor material 412 (e.g., silicon substrate) via the direct tunneling simultaneously with transporting high-energy electrons (e.g., hot electrons) from a source region of the semiconductor material 412. Further, during an erase operation, the multi-mechanism charge transport may include transporting low-energy holes from a gate (e.g., a metal gate 450) via the direct tunneling simultaneously with transporting high-energy holes from a diffusion/substrate high-field region of the semiconductor material 412.

As shown in FIG. 4, the programming pathway 456 includes a semiconductor material 412, a tunneling material 420 adjacent to (e.g., formed on) the semiconductor material 412, a charge trapping material 430 adjacent to the tunneling material 420, a charge storage material 432 (e.g., In-SRN) adjacent to the charge trapping material 430, a charge blocking material 440 adjacent to the In-SRN, and an interface metallic material/metal gate 442/450 adjacent to the charge blocking material 440. In a number of embodiments, the interface metallic material 442 may include TaN, and the charge trapping material 430 may include GaN.

In a number of embodiments, the EOT of the tunneling material 420 may be about 1.3 nm; the EOT of the charge trapping material 430 and the In-SRN 432 may be about 2.2 nm; and the EOT of the charge blocking material 440 may be about 1.0 nm. As such, the EOT of the programming pathway 456 (e.g., a memory cell including the programming pathway 456) may be about 4.5 nm. In this embodiment, a programming potential (e.g., Vpp) may be from −4 V to +4V for 5 to 10 ns with a power supply potential (e.g., Vdd) that may be 1.5 V, which would also be a bit-line potential for sensing.

In some embodiments, the tunneling material 420 may further include a first sub-material formed on the semiconductor material 412, a second sub-material adjacent to (e.g., formed on) the first sub-material, and a third sub-material adjacent to the third sub-material. The first sub-material may include $HfO_2$, the second sub-material may include lanthanum aluminate ($LaAlO_3$), the third sub-material may include lanthanum oxide ($La_2O_3$). In this embodiment, the charge blocking material 440 may further include a plurality of sub-materials, and one of the plurality of sub-materials may include HfLaON. For example, the charge blocking material 440 may include a first sub-material adjacent to (e.g., formed on) the In-SRN 432 and a second sub-material adjacent to (e.g., formed on) the first sub-material. The first sub-material may include $La_2O_3$ and the second sub-material may include HfLaON. The embodiment may be implemented in memory cells 210-2 and/or 210-3 as described in connection with FIGS. 2C and 2D (e.g., L3- and/or L4-level memory).

In the embodiment of the programming pathway 456 described as including $HfO_2$, $LaAlO_3$, and $La_2O_3$, as the sub-materials of the tunneling material 420, the first tunneling sub-material (e.g., 420) including $HfO_2$ may be 1.0 nm; the second tunneling sub-material (e.g., 420) including $LaAlO_3$ may be 1.5 nm; the third tunneling sub-material (e.g., 430) including $La_2O_3$ may be 2 nm; the charge trapping material 430 including GaN may be 3 nm; the charge storage material 432 (e.g., In-SRN) may be 3 nm; the first charge blocking sub-material (e.g., 440) including $La_2O_3$ may be 3 nm; and the second charge blocking sub-material (e.g., 440) including HfLaON may be 3 nm. In sum, a physical thickness of a portion of the programming pathway 456 (e.g., from the first tunneling sub-material to the second charge blocking sub-material).

In the embodiment of the programming pathway 456 described as including $HfO_2$, $LaAlO_3$, and $La_2O_3$, as the sub-materials of the tunneling material 420), in the programming pathway 456, charges may be transported via the multi-mechanism charge transport. For example, programming (e.g., write operation) a memory cell including the programming pathway 456 to the target state may be performed by transporting low-energy electrons (e.g., multiple direct tunnelings) from a source region of (e.g., implemented in) the semiconductor material 412 to the charge trapping material 430 via the direct tunneling simultaneously with transporting high-energy electrons from a source diffusion node of the semiconductor material 412 to the charge trapping material 430 and higher-energy electrons from a n+ source of the semiconductor material 412 to the charge trapping material 430 via a channel hot electron (CHE) mechanism. Further, programming a memory cell including the programming pathway 456 to the erased state may, for example, be performed by removing electrons (e.g., low-energy electrons) from the charge trapping material 430 via the direct tunneling simultaneously with transporting lower-energy holes from the gate 450 and high-energy holes from a diffusion/substrate high-field region of the semiconductor material to the charge trapping material 412 via the CHE mechanism.

In the embodiment of the programming pathway 456 described as including $HfO_2$, $LaAlO_3$, and $La_2O_3$, as the sub-materials of the tunneling material 420). A programming (for writing) voltage of about +4.0 V may be applied for 10 ns or less to the gate 450 (e.g., program gate) and the gate 450 (e.g., select gate) may be turned on with +1V. In a number of embodiments, the bit line (drain node) may be held at ground, while the source line (source node) may be raised to +3.0V to facilitate the CHE mechanism. This allows a transport of low-energy electrons simultaneously with a transport of high-energy electrons via the CHE mechanism for hot electron injection and trapping. During the erase operation, a voltage potential of a source line may be increased up to +4.0V with substrate floating, and a voltage potential of a program gate may be held at low voltage of +1V while a select gate may be held at high potential of +3.5 V with bit line at ground. This allows transporting holes from the semiconductor material 412 simultaneously with transporting high-energy holes from a source/substrate edge of the semiconductor material 412 to provide fast erase operation as compared to those programming pathways based solely on a tunneling mechanism.

In some embodiments, the tunneling material 420 further may include a first sub-material adjacent to (e.g., formed on) the semiconductor material 412, a second sub-material adjacent to the first sub-material, and a third sub-material adjacent to the second sub-material. The first sub-material (e.g., the interface dielectric as described in connection with FIG. 2) may include OR-SiON, the second sub-material may include $La_2O_3$, the third sub-material may include $HfO_2$. In this embodiment, the charge blocking material 440 may include HfLaON. The embodiment may be implemented as memory cells 210-2 and/or 210-3 as described in connection with FIGS. 2C and 2D (e.g., L3- and/or L4-level memory).

In this embodiment, the first tunneling sub-material (e.g., 420) including OR-SiON may be 1 nm; the second tunneling sub-material (e.g., 420) including $La_2O_3$ may be 2 nm; the third tunneling (e.g., 420) including $HfO_2$ may be 1.5 nm; the charge trapping material 430 including GaN may be 3 nm; the In-SRN 432 may be 3 nm; and/or the charge blocking material 440 including HfLaON may be 5 nm. In sum, a physical thickness of a portion of the programming pathway 456 (e.g., from the first tunneling sub-material to the charge blocking material) may be 15.5 nm. The tunneling material (e.g., including the first, second, and third sub-materials) may be the PBO tunnel barrier for transporting electrons via the direct tunneling (e.g., as described in connection with FIG. 2B).

In the embodiment of the programming pathway 456 described as including OR-SiON, $La_2O_3$, and $HfO_2$, as the sub-materials of the tunneling material 420), a memory cell including the programming pathway 456 may be programmed to a target state via a multi-mechanism charge transport. For example, programming the memory cell including the programming pathway 456 to the target state other than an erased state may be performed by transporting electrons from the semiconductor material 412 to the charge trapping material 430 via a direct tunneling (e.g., transporting low-energy electrons via the direct tunneling) simultaneously with transporting higher energy electrons (e.g., significantly higher-energy electrons) from a source region (e.g., located internal to the semiconductor material 412) to the charge trapping material 430 via F-N tunneling. Further, programming the memory cell including the programming pathway 456 to the erased state may, for example, be performed by transporting holes (e.g., low-energy holes) from the metal gate 450 to the charge trapping material 430 simultaneously with transporting holes (e.g., high-energy holes) from the semiconductor material 412 to the charge trapping material 430.

In the embodiment of the programming pathway 456 described as including OR-SiON, $La_2O_3$, and $HfO_2$, as the sub-materials of the tunneling material 420, a program voltage for writing of about +4.0 V and +3.0V may be applied for about 5 to 10 ns to a program gate and a source line respectively. In this embodiment, an erase voltage +1.0 V and +4.0 V may be applied to the program gate and the source line respectively for about 5 to 10 ns along with select gate at +3.5V for about 5 to 10 ns. An end-of-life memory window of the embodiment may range from around +0.5V to +1.0V for L1-L2- and/or L3-level functionality whereby specific thickness and stack EOT could be altered along with operating conditions to achieve a desired functional and application parameters.

In some embodiments, the tunneling material 420 further may include a first sub-material adjacent to the semiconductor material 412 and a second sub-material adjacent to (e.g., formed on) the first sub-material. The first sub-material may include OR-SiON and the second sub-material may include $HfO_2$. In this embodiment, the charge blocking material 440 may include a first sub-material adjacent to the In-SRN 432 and a second sub-material adjacent to the first sub-material. The first sub-material may include $HfO_2$ and the second sub-material may include HfLaON. The tunneling material (e.g., including the first and the second sub-materials) may be a variable oxide thickness (VARIOT) tunnel barrier that may provide barrier thinning.

In this embodiment, the first tunneling sub-material (e.g., 420) including OR-SiON may be 1 nm; the second tunneling sub-material (e.g., 420) including $HfO_2$ may be 3 nm; the charge trapping material 430 including GaN may be 3 nm; the In-SRN 432 may be 3 nm; the first charge blocking sub-material (e.g., 440) including $HfO_2$ may be 2.5 nm; and/or the second charge blocking sub-material (e.g., 440) including HfLaON may be 3 nm. In sum, a physical thickness of a portion of the programming pathway 456 (e.g., from the first tunneling sub material to the second charge blocking sub-material) may be 15.5 nm.

In the embodiment of the programming pathway 456 described as including OR-SiON, and $HfO_2$ as the sub-materials of the tunneling material 420, a memory cell including the programming pathway 456 may be programmed to a target state via a multi-mechanism charge transport. For example, programming the memory cell including the programming pathway 456 to the target state other than an erased state may be performed by transporting electrons from the semiconductor material 412 to the charge trapping material 430 via a direct tunneling simultaneously with transporting electrons from a source region (e.g., located internal to the semiconductor material 412) to the charge trapping material 430. Further, programming the memory cell including the programming pathway 456 to the erased state may, for example, be performed by transporting holes (e.g., low-energy holes) from the metal gate 450 to the charge trapping material 430 simultaneously with transporting holes (e.g., high-energy holes) from the semiconductor material 412 to the charge trapping material 430.

In the embodiment of the programming pathway 456 described as including OR-SiON and $HfO_2$ as the sub-materials of the tunneling material 420, a program/erase voltage of about ±4.0 V may be applied for 10 ns or less. An end-of-life memory window of the example may range from about +0.5V to +1.0V.

Figure 5:
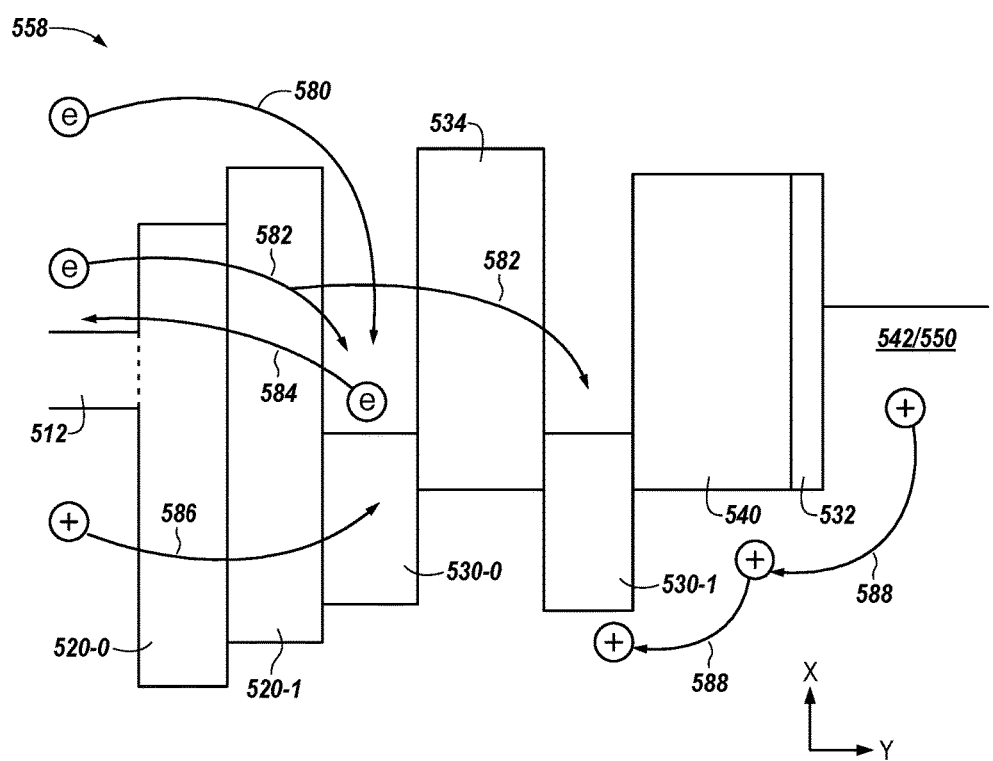
FIG. 5 illustrates another example of a programming pathway including a plurality of charge trapping materials for transporting charges via a multi-mechanism charge transport in accordance with a number of embodiments of the present disclosure.

FIG. 5 illustrates an example of a programming pathway 558 including a plurality of charge trapping materials for transporting charges via the multi-mechanism charge transport in accordance with a number of embodiments of the present disclosure. In a number of embodiments, during a programming operation (e.g., write operation), the multi-mechanism charge transport may include transporting low-energy electrons from the semiconductor material 512 (e.g., silicon substrate) via the direct tunneling (e.g., as shown by an arrow 582) simultaneously with transporting high-energy electrons from the semiconductor material 512 via the F-N tunneling (e.g., as shown by an arrow 580). Further, during an erase operation, the multi-mechanism charge transport may include removing low-energy electrons from the charge trapping material 530 via the direct tunneling (e.g., as shown by an arrow 584) simultaneously with transporting low-energy holes from the semiconductor material 512 via the direct tunneling (e.g., as shown by an arrow 586).

As shown in FIG. 5, the programming pathway 558 may include a semiconductor material 512, a first tunneling sub-material 520-0 adjacent to (e.g., formed on) the semiconductor material, and a second tunneling sub-material 520-1 adjacent to the first tunneling sub-material 520-0, a first charge trapping material 530-0 adjacent to the second tunneling sub-material 520-1, an intermediate material 534 adjacent to the first charge trapping material 530-0, a second charge trapping material 530-1 adjacent to the intermediate material 534, a charge blocking material 540 adjacent to the second charge trapping material 530-1, an In-SRN 532 adjacent to the charge blocking material 540, and/or an interface metallic material/metal gate 542/550 adjacent to the In-SRN 532. In a number of embodiments, the interface metallic material 542 may include a dielectric material selected from TaN and titanium nitride (TiN).

As further shown in FIG. 5, each of the first and the second charge trapping materials 530-0 and 530-1 may be separated from each other by the intermediate material 534 and the first charge trapping material 530-0 may be formed closer to the semiconductor material 512 than the second charge trapping material 530-1. The first tunneling sub-material may include $HfO_2$ and the second tunneling sub-material may include $LaAlO_3$.

In a number of embodiments, at least one of the first and the second charge trapping materials 530-0 and 530-1 includes GaN. For example, the first charge trapping material 530-0 may include GaN and the second charge trapping material 530-1 may include aluminum nitride (AlN). However, embodiments are not so limited. For example, both of the first and the second charge trapping materials 530-0 and 530-1 may include GaN.

In a number of embodiments, the first tunneling sub-material 520-0 including $HfO_2$ may be 1.5 nm thick; the second tunneling sub-material 520-1 including $LaAlO_3$ may be 1.5 nm thick; the first charge trapping material 530-0 including GaN may be 5 nm thick; the intermediate material 534 including $La_2O_3$ may be 5 nm; the second charge trapping material 530-1 including either GaN or AlN may be 5 nm; the charge blocking material including $La_2O_3$ 540 may be 10 nm; and/or the interface passivation material including In-SRN 532 may be 2 nm to 5 nm thick. In sum, the programming pathway 558 as shown in FIG. 5 may be about 30 to 33 nm thick, and the EOT of the programming pathway 558 may be about 6.5 nm. In this embodiment, a programming potential (e.g., Vpp) may be from −4 V to +4V for 10 to 30 ns with a power supply potential (e.g., Vdd) that may be 1.5 V, which may be a bit-line potential for sensing. An end-of-life memory window of the embodiment may range from around +0.5 V to +1.0 V for L2- and/or L3-level functionality whereby specific thickness and stack EOT may be altered along with Vpp to achieve a desired functional and application parameters, and further to be implemented as L4- and/or L5-level memories (e.g., including MLCs).

A memory cell including the programming pathway 558 including a plurality of charge trapping materials (e.g., charge trapping materials 530-0 and 530-1) may be a MLC that may be programmed to a plurality of data states. For example, a memory cell including the programming pathway 558 may be programmed to four different data states (e.g., binary data states such as 00, 01, 10, and 11), for example, by applying a plurality of different voltages for different duration (e.g., pulse duration). In a number of embodiments, the memory cell including the programming pathway 558, as a MLC, may be implemented as L4- and/or L5-level memory, although embodiments are not so limited.

In some embodiments, a memory cell including the programming pathway 558 may be programmed to a first data state (e.g., binary state 01) by applying a first voltage (e.g., +4V for 0.1 us). As a result of the application, electrons may be transported from the semiconductor material 512 to the first charge trapping material 530-0 (e.g., as shown by an arrow 580) via a direct tunneling, and the application may result in a larger memory window with enhanced threshold voltage for the written state.

In some embodiments, a memory cell including the programming pathway 558 may be programmed to a second data state (e.g., binary state 10) by applying a second voltage (e.g., +6V for 0.1 us) that may be greater than the first voltage. As a result of the application, electrons may be transported from the semiconductor material 512 to the charge trapping material 530-0 via the direct tunneling. Simultaneously, electrons may be transported from the semiconductor material 512 to the charge trapping material 530-1 (e.g., as shown by an arrow 582) via the F-N tunneling. Similarly, hole transport and trapping may also be enhanced. The application may result in a larger memory window with a higher threshold state to enable MLC operability and L4-level functionality.

In some embodiments, a memory cell including the programming pathway 558 may be programmed to a third data state (e.g., binary state 11) by applying a third voltage (e.g., +5V for 10 us) that may be greater than the first voltage but less than the second voltage. As a result of the application, electrons may be transported to the first charge trapping material 530-0, for example, via the direct tunneling. Simultaneously, electrons may be further transported to the second charge trapping material 530-1, for example, via the F-N tunneling. The application may result in a threshold voltage of +3V across the memory cell including the programming pathway 558.

The second voltage may be large enough not only to transport electrons from the semiconductor material 512 to the second charge trapping material 530-1 (e.g., via the F-N tunneling), but also to transport holes from the control gate 550 to the second trapping material 530-1 (e.g., as shown by an arrow 588). Since the holes transported from the control gate 550 offsets electrons further transported to the second charge trapping material 530-1, the threshold voltage (e.g., +3V) caused by applying the third voltage (e.g., +5V) may be greater than the threshold voltage (e.g., +2V) caused by applying the second voltage (e.g., +6V) despite that the second voltage may be greater than the third voltage. In a number of embodiments, a memory cell including the programming pathway 558 may be programmed to an erased state by applying a negative voltage (e.g., −2V), which results in a threshold voltage of −2V.

In some embodiments, multiple pulsing voltages and duration of pulsing scheme may be employed to the multi-mechanism transport-induced charge transport and trapping to enable MLC capability for L3, or L4 or L5 functionality. While embodiments including various combinations and configurations of semiconductor structures have been illustrated and described herein, embodiments of the present disclosure are not limited to those combinations explicitly recited herein. Other combinations and configurations of the semiconductor structures of memory cells based on multi-mechanism carrier transport and trapping with variable charge retention capacity should be envisioned and should be considered as disclosed herein and are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a semiconductor material;
a tunneling material formed on the semiconductor material, the tunneling material further comprising:
    a first sub-material formed on the semiconductor material, the first sub-material comprising oxygen-rich silicon oxynitride (OR-SiON);
    a second sub-material formed on the first sub-material, the second sub-material comprising lanthanum oxide ($La_2O_3$); and
    a third sub-material formed on the second sub-material, the third sub-material comprising hafnium dioxide ($HfO_2$);
a charge trapping material formed on the tunneling material, wherein the charge trapping material comprises gallium nitride (GaN);
a charge blocking material formed on the charge trapping material; and
a metal gate formed on the charge blocking material; and
wherein the memory cell is programmed to a target state via a multi-mechanism charge transport such that charges are simultaneously transported to the charge trapping material through a plurality of different channels.

2. The memory cell of claim 1, wherein the multi-mechanism charge transport comprises:
transport of electrons from the semiconductor material to the charge trapping material via a direct tunneling simultaneously with transport of electrons from the semiconductor material to the charge trapping material via a Fowler-Nordheim (F-N) tunneling.

3. The memory cell of claim 1, wherein:
the memory cell is programmed to an erased state as the target state via the multi-mechanism charge transport comprising:
    transport of holes from the metal gate to the charge trapping material simultaneously with transport of holes from the semiconductor material to the charge trapping material.

4. The memory cell of claim 1, wherein the tunneling material is a progressive band offset (PBO) tunnel barrier.

5. The memory cell of claim 1, wherein the tunneling material is a variable oxide thickness (VARIOT) tunnel barrier.

6. The memory cell of claim 1, further comprising an injector silicon-rich nitride (In-SRN) formed between the charge trapping material and the charge blocking material.

7. The memory cell of claim 1, wherein:
the charge blocking material further comprises a plurality of sub-materials; and
one of the plurality of sub-materials comprises hafnium lanthanum oxynitride (HfLaON).

8. The memory cell of claim 1, further comprising:
an interface metallic material formed between the charge blocking material and the metal gate; and
wherein the interface metallic material comprises tantalum nitride (TaN).

9. A method, comprising:
forming a semiconductor material;
forming a tunneling material on the semiconductor material, wherein forming the tunneling material on the semiconductor material further comprises:
    forming a first sub-material on the semiconductor material, the first sub-material comprising oxygen-rich silicon oxynitride (OR-SiON);
    forming a second sub-material on the first sub-material, the second sub-material comprising lanthanum oxide ($La_2O_3$); and
    forming a third sub-material on the second sub-material, the third sub-material comprising hafnium dioxide ($HfO_2$);
forming a charge trapping material on the tunneling material, wherein the charge trapping material comprises gallium nitride (GaN);
forming a charge blocking material on the charge trapping material; and
forming a metal gate on the charge blocking material; and
wherein the memory cell is programmed to a target state via a multi-mechanism charge transport such that charges are simultaneously transported to the charge trapping material through a plurality of different channels.

* * * * *